(12) United States Patent
Jungwirth

(10) Patent No.: US 9,000,290 B2
(45) Date of Patent: Apr. 7, 2015

(54) MULTI SENSOR SOLAR COLLECTION SYSTEM

(75) Inventor: Douglas R. Jungwirth, Porter Ranch, CA (US)

(73) Assignee: The Boeing Company, Chicago, IL (US)

( * ) Notice: Subject to any disclaimer, the term of this patent is extended or adjusted under 35 U.S.C. 154(b) by 657 days.

(21) Appl. No.: 13/252,024

(22) Filed: Oct. 3, 2011

(65) Prior Publication Data

US 2013/0081669 A1  Apr. 4, 2013

(51) Int. Cl.
*H01L 31/042* (2014.01)
*H01L 31/054* (2014.01)

(52) U.S. Cl.
CPC .......... *H01L 31/0543* (2013.01); *H01L 31/042* (2013.01); *Y02E 10/52* (2013.01); *H02S 20/00* (2013.01)

(58) Field of Classification Search
CPC .............. H01L 31/0543; H01L 31/054; H01L 31/0524; H01L 31/042
USPC .................................................. 136/244, 246
See application file for complete search history.

(56) References Cited

U.S. PATENT DOCUMENTS

2010/0170559 A1* 7/2010 McGlynn et al. ............. 136/246

* cited by examiner

*Primary Examiner* — Allison Bourke
(74) *Attorney, Agent, or Firm* — Vista IP Law Group LLP; Cynthia A. Dixon

(57) ABSTRACT

A system, method, and apparatus for a multi sensor solar collection system are disclosed herein. The disclosed method for controlling the disclosed multi sensor solar collection system involves providing a plurality of different sets of solar cells that have different spectral response properties. The method also involves focusing, with at least one focusing element, a light beam on a first set of the solar cells according to a current light condition. Further, the method involves focusing, with at least one focusing element, the light beam on a second set of the solar cells according to a change in the current light condition. In other embodiments, the method involves moving a planar mounting that the solar cells are mounted on to focus the light beam on the second set of solar cells according to the change in the current light condition.

20 Claims, 6 Drawing Sheets

MULTI SENSOR SOLAR COLLECTION SYSTEM

BACKGROUND

The present disclosure relates to solar collection systems. In particular, it relates to multi sensor solar collection systems.

SUMMARY

The present disclosure relates to a method, system, and apparatus for a multi sensor solar collection system. In one or more embodiments, the present disclosure teaches a method for controlling a multi sensor solar collection system that involves providing a plurality of different sets of solar cells. The method further involves focusing, with at least one focusing element, a light beam on a first set of the solar cells according to a current light condition. Further, the method involves focusing, with at least one focusing element, the light beam on a second set of the solar cells according to a change in the current light condition.

In at least one embodiment, the method further involves tracking, with a solar tracker, a light source for the light beam. In one or more embodiments, the solar tracker is able to control the movement of a housing that houses at least one focusing element and the plurality of different sets of solar cells. In some embodiments, the focusing, with at least one focusing element, is achieved by the solar tracker moving the housing accordingly.

In at least one embodiment, the different sets of the solar cells have different spectral response properties. In some embodiments, the spectral response properties are at least one of absorptive of ultraviolet (UV) and blue light, absorptive of visible light, and absorptive of infrared (IR) photons at various relative absorption ratios. In one or more embodiments, the solar cells are arranged adjacent to one another. In at least one embodiment, the solar cells are arranged in an array configuration. In some embodiments, the solar cells are arranged in a matrix configuration. In one or more embodiments, the solar cells are mounted on a planar mounting. In some embodiments, at least one focusing element is a lens.

In one or more embodiments, a method for controlling a multi sensor solar collection system involves providing a plurality of different sets of solar cells that are mounted on a planar mounting. The method also involves focusing, with at least one focusing element, a light beam on a first set of the solar cells according to a current light condition. Further, the method involves moving the planer mounting to focus the light beam on a second set of the solar cells according to a change in the current light condition. In some embodiments, the method further involves tracking, with a solar tracker, a light source for the light beam. The solar tracker is able to control the movement of a housing that houses at least one focusing element and the plurality of different sets of solar cells that are mounted on the planar mounting.

In at least one embodiment, the different sets of the solar cells on the planar mounting have different spectral response properties. In some embodiments, the spectral response properties are at least one of absorptive of ultraviolet (UV) and blue light, absorptive of visible light, and absorptive of infrared (IR) photons at various relative absorption ratios. In one or more embodiments, the solar cells are arranged adjacent to one another on the planar mounting. In at least one embodiment, the solar cells are arranged in an array configuration on the planar mounting. In some embodiments, the solar cells are arranged in a matrix configuration on the planar mounting. In one or more embodiments, at least one focusing element is a lens.

In one or more embodiments, a multi sensor solar collection system involves a plurality of different sets of solar cells, and at least one focusing element. At least one focusing element is configured to focus a light beam on a first set of the solar cells according to a current light condition, and to focus the light beam on a second set of the solar cells according to a change in the current light condition. In at least one embodiment, the system further involves a solar tracker configured to track a light source for the light beam.

In at least one embodiment, a multi sensor solar collection system involves a plurality of different sets of solar cells, at least one focusing element, and a planar mounting. At least one focusing element is configured to focus a light beam on a first set of the solar cells according to a current light condition. The solar cells are mounted on the planar mounting. Also, the planar mounting is configured to move to focus the light beam on a second set of the solar cells according to a change in the current light condition.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

FIG. 1 is a schematic diagram of a multi sensor solar collection system that has a focusing element used to focus a light beam on a set of solar cells, in accordance with at least one embodiment of the present disclosure. In this configuration, the sensors (i.e. solar cells) and the collection lens(es) are tilted in unison to achieve the movement of the focus to a different location on the solar array.

DESCRIPTION

Figure 1:
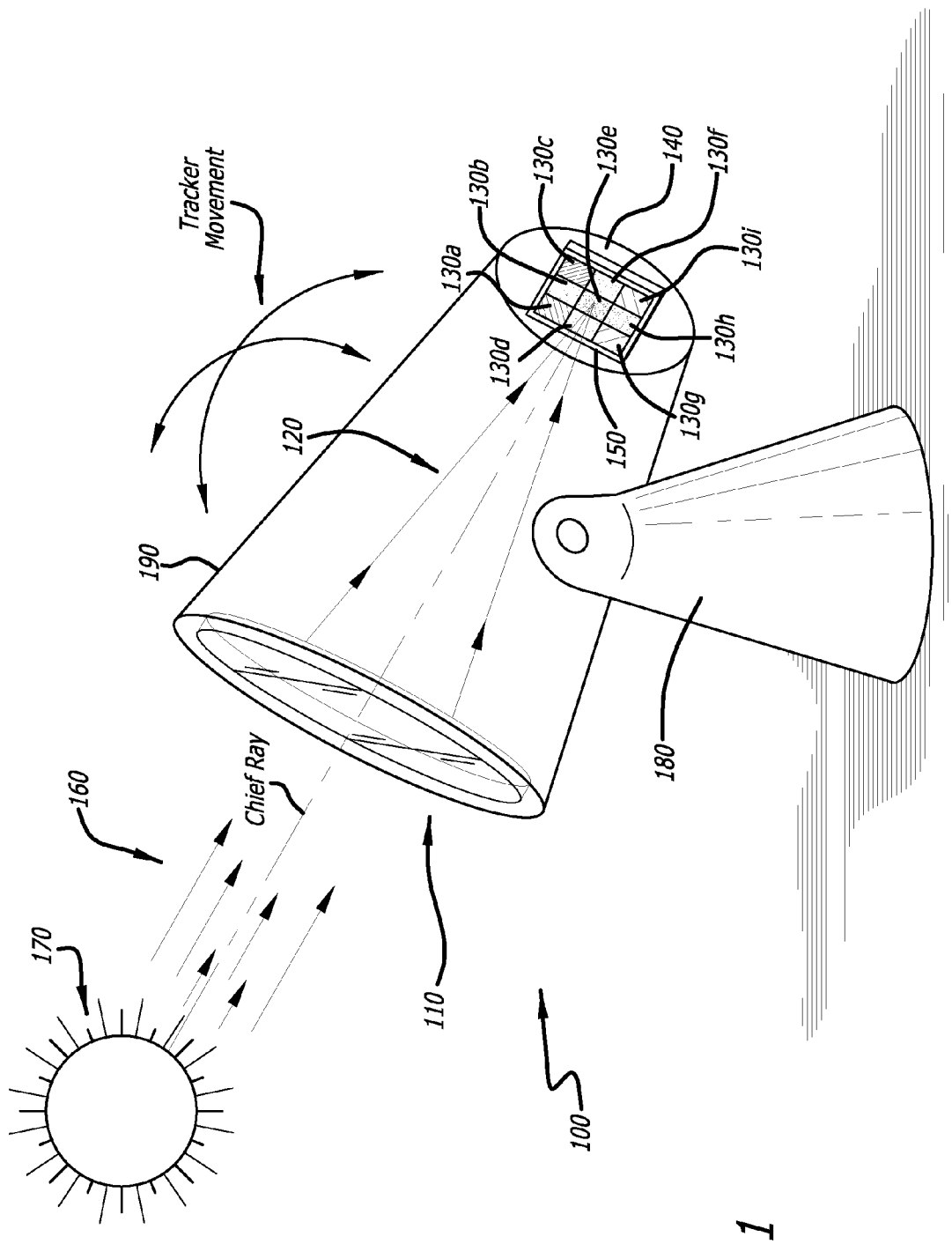

The methods and apparatus disclosed herein provide an operative system for a multi sensor solar collection system. Specifically, this system employs a system level architecture for terrestrial solar energy collection that uses multiple sets of specially designed solar cells, each slightly different in design, that allow for optimization of the solar collection efficiencies based on the spectrum of light that is present.

Currently, multi-junction solar cells provide the most efficient conversion of terrestrial solar energy to electrical power. These solar cells are matched to the solar spectrum that is predicted to be shining in the area of the collectors of the solar cells. If the spectral responses of these solar cells are not matched correctly to the solar spectrum, the conversion efficiency decreases, sometimes dramatically.

Multi-junction solar cells consist of several layers of current generating electrical materials. Each individual solar cell is referred to as a "cell". Each "cell" acts as an independent battery that produces a voltage and a current; and each "cell" is manufactured to create electrical power from only a specific range of spectral illumination. During operation of the multi-junction solar cells, voltages produced by each of the individual cells add to produce a resultant voltage that is generated by the combined system. However, the resultant current generated by the combined system is limited to the lowest current that is produced by the individual cells. For example, if all but one of the cell junctions are producing currents of 1 amp, and the remaining cell junction is producing a current of 0.5 amps, the resultant current generated by the combined system will be 0.5 amps. Because of this feature, solar cell manufacturers balance the spectral range of each "cell" based on expected available spectrum of light so as to balance the currents the best as possible, thereby maximizing the overall efficiency of the combined system.

Conventional multi-junction solar cells, that are currently used in industry, have the currents that are generated by all of the individual junctions balanced. The current generated by each individual junction is dependent on the input spectrum of light that the particular cell is responsive. Typically, solar energy collectors are designed to choose only one 'design' spectrum of light, and the type of solar cells chosen for the design are optimally responsive to only that spectrum of light. However, the spectrum (in operational systems) of light changes from hour to hour, day to day, month to month, and season to season. As such, these changes in the spectrum of light make it so that a system that has only one type of solar cells available to convert light into electrical energy will not operate optimally efficient.

The disclosed system design allows for several sets of different types of solar cells to be co-aligned (or easily re-aligned) to the collection optics. These sets of solar cells are slightly different in their design to allow for differing balances between the individual junctions in the multi-junction solar cells so as to better match the different solar spectrums. By choosing the most closely matched set of solar cells to the available spectrum of light, better conversion efficiencies will be possible at all times.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

FIG. 1 is a schematic diagram of a multi sensor solar collection system 100 that has a focusing element 110 used to focus a light beam 120 on a specific set of solar cells 130e, in accordance with at least one embodiment of the present disclosure. In this figure, the multi sensor solar collection system 100 is shown to include a housing 190 that is able to be gimbaled to different positions. The housing 190 is shown to house the focusing element 110 and a plurality of multi sensor solar cells 140. In addition, the housing 190 is mounted to a solar tracker 180 that tracks a light source 170 for the light beam 120.

In this embodiment, the disclosed multi sensor solar collection system 100 employs a lens for the focusing element 110. However, it should be noted that in other embodiments, the system 100 may employ other types of focusing elements other than a lens for the focusing element 110. In addition, in some embodiments, the disclosed system 100 may utilize more than one focusing element 110.

The system 100 also includes a plurality of multi sensor solar cells 140. The multi sensor solar cells 140 include sets 130a-i of different types of solar cells. The different sets 130a-i of solar cells have different spectral responses. For example, the different spectral responses for the different sets 130a-i of solar cells may include, but are not limited to, absorptive of ultraviolet (UV) and blue light, absorptive of visible light, and absorptive of infrared (IR) photons in differing relative ratios.

Each of the sets of solar cells 130a-i contains one or more individual solar cells. In this figure, the sets of solar cells 130a-i are shown to be mounted on a planar mounting 150, and arranged adjacent to one another in a matrix configuration. However, it should be noted that in other embodiments of the present disclosure, the sets of solar cells 130a-i may be mounted on other different types of mountings than planar-type mountings. Also, in other embodiments, the sets of solar cells 130a-i may be arranged in other types of configurations including, but not limited to, an array configuration, other types of symmetrical configurations, and other types of asymmetrical configurations.

During operation of the disclosed multi sensor solar collection system 100, the solar tracker 180 tracks light 160 from a light source 170. The solar tracker 180 gimbals the housing 190 so that the focusing element 110 captures light 160 from the light source 170, and focuses a light beam 120 onto a specific set 130e of the solar cells according to the current spectrum of light. For example, if the current spectrum of light is of a specific spectral distribution, the solar tracker 180 will gimbal the housing 190 so that the focusing element 110 will focus the light beam 120 onto a particular set 130e of solar cells that has the closest spectral responsivity (i.e. absorptive) to that spectral distribution.

Once the spectrum of light changes, the housing 190 is gimbaled by the solar tracker 180 so that the focusing element 110 is able to focus the light beam 120 onto a different set 130a of the solar cells according to the new spectrum of light. For example, if the spectrum of light changes to a higher infrared relative content, the housing 190 will gimbal so that the focusing element 110 focuses the light beam onto a set 130a of solar cells that has a better responsivity (i.e. absorptive) to infrared photons. It should be noted that this example is depicted in the figures where in FIG. 1, the chief ray of the light beam 120 is focused on the 130e set of solar cells; and in FIG. 2, the chief ray of the light beam 120 is now focused on the 130a set of solar cells.

Figure 2:
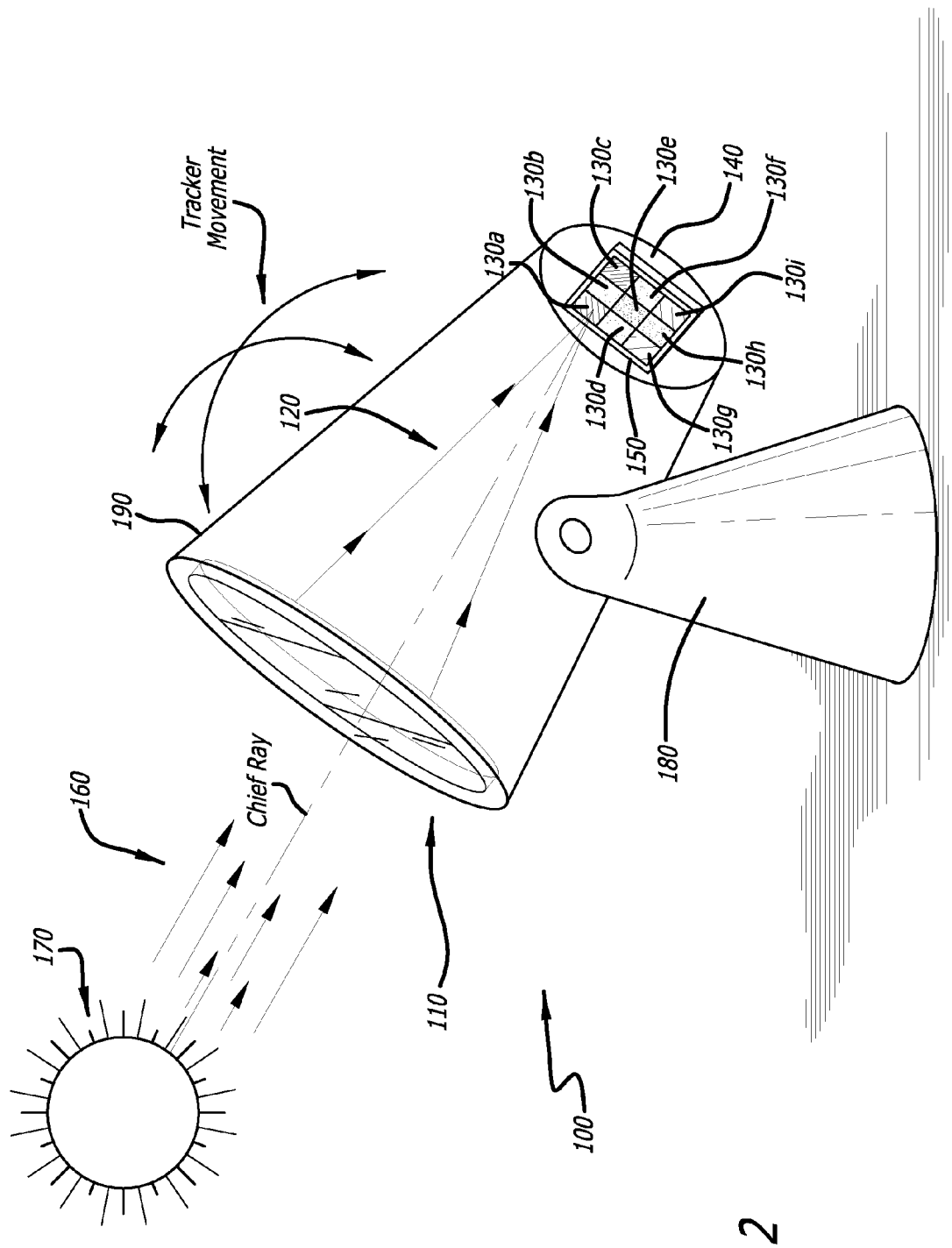
FIG. 2 is a schematic diagram of the multi sensor solar collection system of FIG. 1 where a housing is gimbaled to focus the light beam on a different set of solar cells, in accordance with at least one embodiment of the present disclosure.

FIG. 2 is a schematic diagram of the multi sensor solar collection system 100 of FIG. 1 where the housing 190 is gimbaled to focus the light beam 120 on a different set 130a of solar cells, in accordance with at least one embodiment of the present disclosure. This figure specifically shows the housing 190 being gimbaled to cause the focusing element 110 to focus the light beam 120 on a different set of 130a of solar cells according to the new spectrum of light.

Figure 3:
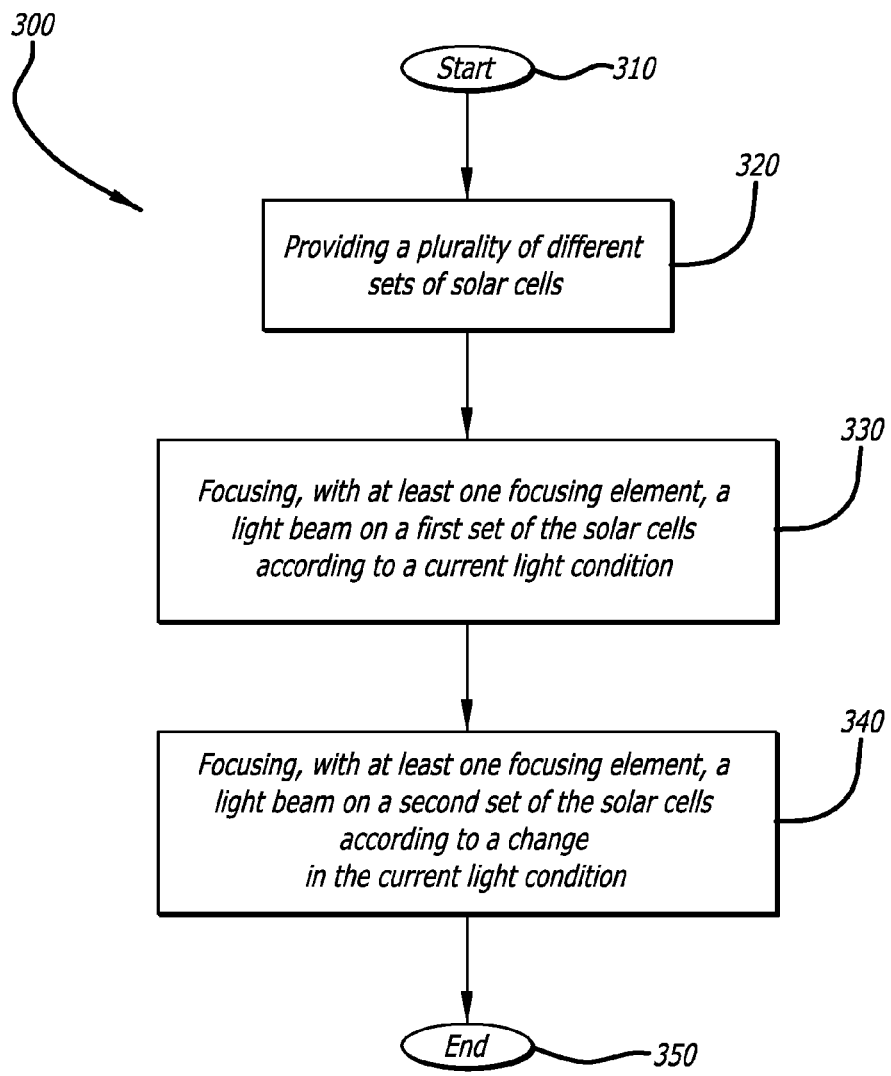
FIG. 3 is a flow diagram of the method for controlling the multi sensor solar collection system of FIGS. 1 and 2, in accordance with at least one embodiment of the present disclosure.

FIG. 3 is a flow diagram 300 of the method for controlling the multi sensor solar collection system 100 of FIGS. 1 and 2, in accordance with at least one embodiment of the present disclosure. At the start 310 of the method, a plurality of different sets of solar cells are provided 320. Then, at least one focusing element is used to focus a light beam on a first set of the solar cells according to a current light condition 330. When the light condition changes, at least one focusing element is used (e.g., gimbaled along with the housing) to focus the light beam on a second set of the solar cells according to the change in light condition 340. After the focusing element focuses the light beam on the second set of the solar cells, the method ends 350.

Figure 4:
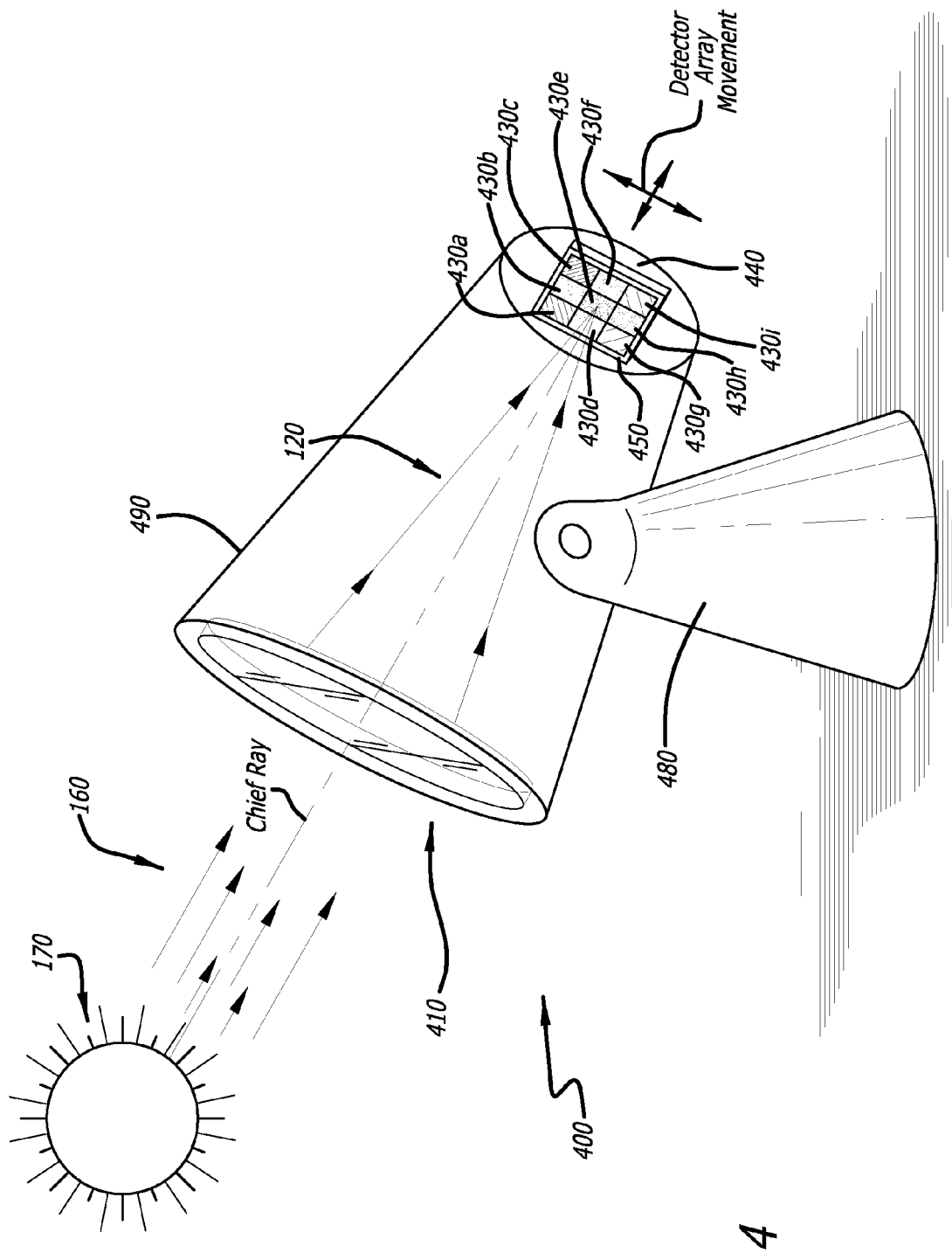
FIG. 4 is a schematic diagram of a multi sensor solar collection system that has different sets of solar cells mounted on a movable planar mounting, in accordance with at least one embodiment of the present disclosure.

FIG. 4 is a schematic diagram of a multi sensor solar collection system 400 that has different sets 430a-i of solar cells mounted on a movable planar mounting 450, in accordance with at least one embodiment of the present disclosure. In this figure, a plurality of multi sensor solar cells 440 are shown to be mounted on a movable planar mounting 450. The plurality of multi sensor solar cells 440 include sets 430a-i of different types of solar cells. The different sets 430a-i of solar cells have different spectral responses including, but are not limited to, absorptive of ultraviolet (UV) and blue light, absorptive of visible light, and absorptive of infrared (IR) photons with various absorption ratios. In addition, the multi sensor solar collection system 400 is shown to include a housing 490 that is able to be gimbaled to different positions. The housing 490 is shown to house a focusing element 410 and the plurality of multi sensor solar cells 440. Additionally, the housing 490 is mounted to a solar tracker 480 that tracks a light source 170 for a light beam 120.

During operation of the system 400, the solar tracker 480 tracks light 160 from a light source 170. The solar tracker 480 gimbals the housing 490 so that the focusing element 410 captures light 160 from the light source 170, and focuses a light beam 120 onto a specific set 430e of the solar cells according to the current spectrum of light. When the spectrum of light changes, the planar mounting 450 moves relative to the focused light (without moving the focusing element 410) so that the light beam 120 is focused by the focusing element 410 onto a different set 430a of solar cells according to the different spectrum of light.

Figure 5:
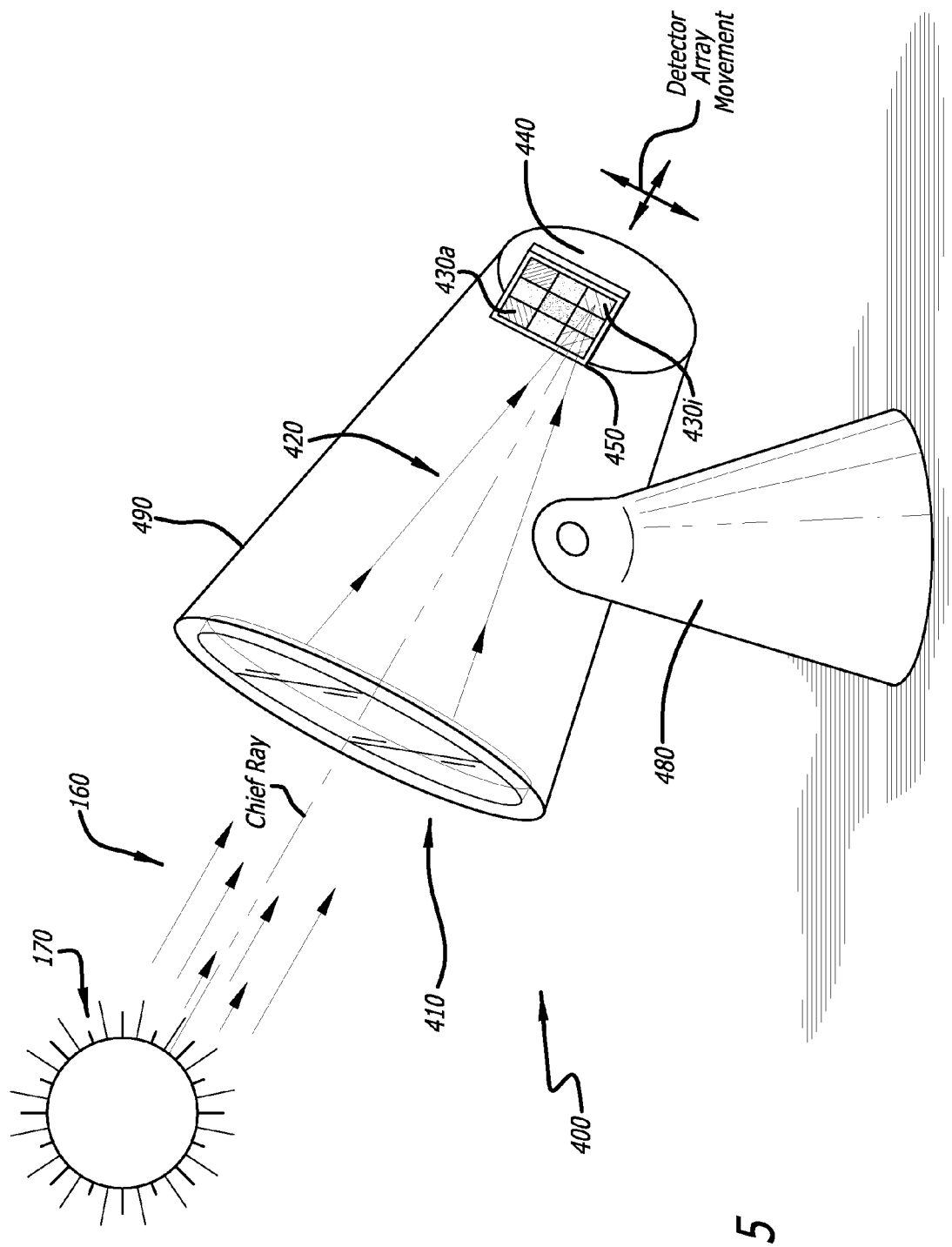
FIG. 5 is a schematic diagram of the multi sensor solar collection system of FIG. 4 where the planar mounting is moved to focus the light beam on a different set of solar cells, in accordance with at least one embodiment of the present disclosure. In this configuration, the planar mounting is moved with respect to the lens(es) and the focus point to change which set of solar cells is illuminated.

FIG. 5 is a schematic diagram of the multi sensor solar collection system 400 of FIG. 4 where the planar mounting 450 is moved to focus the light beam 120 on a different set 430a of solar cells, in accordance with at least one embodiment of the present disclosure. Specifically, in this figure, the planar mounting 450 is shown to be moved (or translated) in a downward direction and a direction to the right so that the light beam 120 is now focused by the focusing element 410 onto a set 430a of solar cells that are located in the upper left-hand corner of the multi sensor solar cells 440.

It should be noted that in one or more embodiments, the planar mounting 450 can be moved in various other directions than just in a planar (or translation) direction, as is shown in FIGS. 4 and 5. For example, the planar mounting 450 may also be able to be moved such that the multi sensor solar cells 440 are angled towards the light beam 120 at different angles. In some embodiments, the planar mounting 450 may be able to be moved in a direction such that the multi sensor solar cells 440 are located at a closer or farther distance from the focusing element 410. In addition, it should be noted that for various embodiments, the system 400 may employ a focusing element 410 that may be able to be gimbaled. For other embodiments, the system 400 may employ a focusing element 410 that may not be able to be gimbaled (i.e. remain in a fixed position). In addition, it should be noted that for some embodiments, the multi sensor solar collection system 400 may employ more than one focusing element 410.

Figure 6:
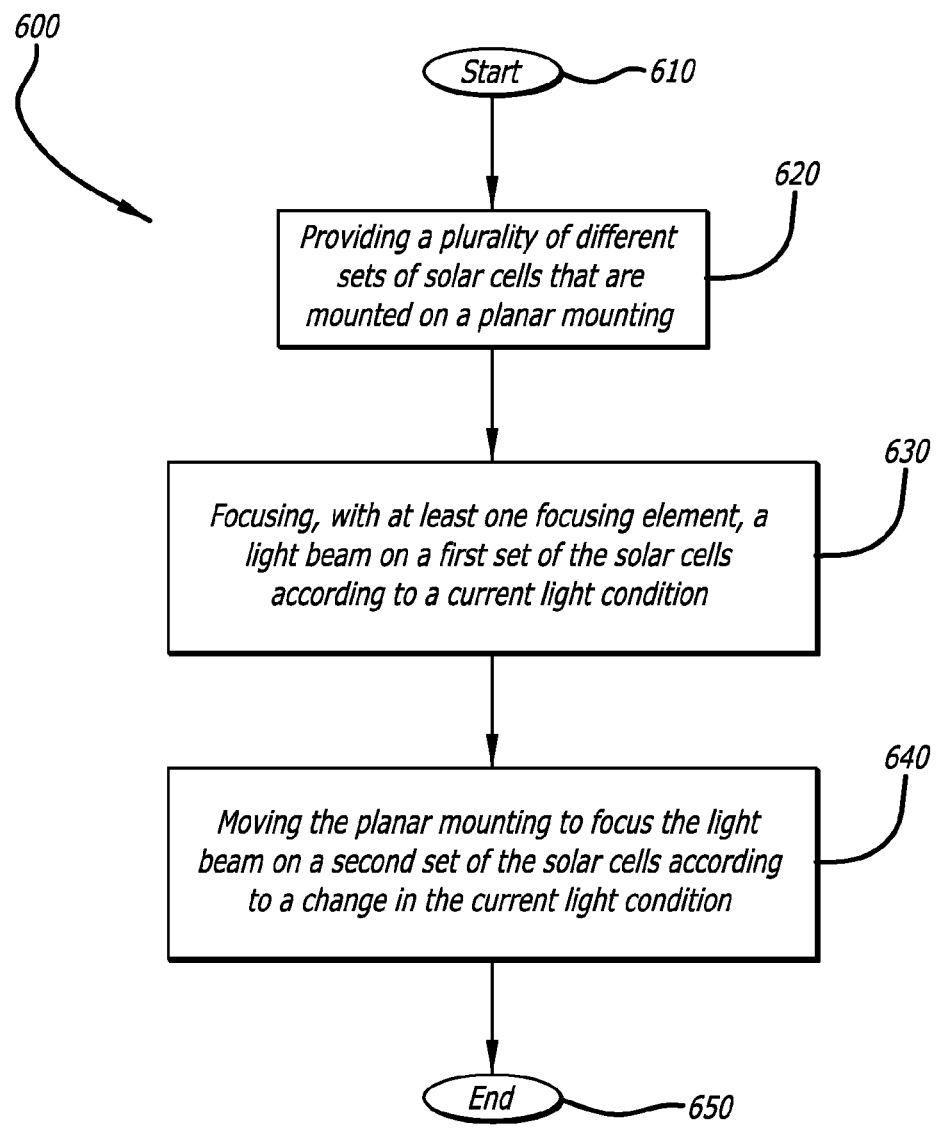
FIG. 6 is a flow diagram of the method for controlling the multi sensor solar collection system of FIGS. 4 and 5, in accordance with at least one embodiment of the present disclosure.

FIG. 6 is a flow diagram 600 of the method for controlling the multi sensor solar collection system 400 of FIGS. 4 and 5, in accordance with at least one embodiment of the present disclosure. At the start 610 of the method, a plurality of different sets of solar cells mounted on planar mounting are provided 620. At least one focusing element is then used to focus the light beam on a first set of the solar cells according to a current light condition 630. After the light condition changes, the planar mounting is moved to focus the light beam on a second set of the solar cells according to the change in the current light condition 640. After planar mounting is moved to focus the light beam on the second set of the solar cells, the method ends 650.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A method for controlling a multi sensor solar collection system, the method comprising:
   providing a plurality of different sets of solar cells;
   a first focusing, with at least one focusing element, a light beam on a first set of the solar cells according to a current light condition; and
   a second focusing, with the at least one focusing element, the light beam on a second set of the solar cells by gimballing the at least one focusing element according to a change in the current light condition,
   wherein during the first focusing, the light beam is not focused on the second set of the solar cells,
   wherein during the second focusing, the light beam is not focused on the first set of the solar cells,
   wherein the first set of the solar cells and the second set of the solar cells are configured into a two-dimensional array.

2. The method of claim 1, wherein gimballing is achieved with a solar tracker.

3. The method of claim 2, wherein the solar tracker is able to control the movement of a housing that houses the at least one focusing element and the plurality of different sets of solar cells.

4. The method of claim 3, wherein the gimballing, with the at least one focusing element, is achieved by the solar tracker gimballing the housing accordingly.

5. The method of claim 1, wherein the different sets of the solar cells have different spectral response properties.

6. The method of claim 5, wherein the spectral response properties are at least one of absorptive of ultraviolet (UV) and blue light, absorptive of visible light, and absorptive of infrared (IR) photons in differing relative ratios.

7. The method of claim 1, wherein the solar cells are arranged adjacent to one another.

8. The method of claim 1, wherein the solar cells are mounted on a planar mounting.

9. The method of claim 1, wherein the at least one focusing element is a lens.

10. A method for controlling a multi sensor solar collection system, the method comprising:
    providing a plurality of different sets of solar cells that are mounted on a planar mounting;

focusing, with at least one focusing element, a light beam on a first set of the solar cells according to a current light condition; and gimballing the planar mounting to focus, with the at least one focusing element, the light beam on a second set of the solar cells according to a change in the current light condition, wherein when the light beam is focused on the first set of the solar cells, the light beam is not focused on the second set of the solar cells, wherein when the light beam is focused on the second set of the solar cells, the light beam is not focused on the first set of the solar cells, wherein the first set of the solar cells and the second set of the solar cells are configured into a two-dimensional array.

11. The method of claim 10, wherein gimballing is achieved with a solar tracker.

12. The method of claim 11, wherein the solar tracker is able to control the movement of a housing that houses the at least one focusing element and the plurality of different sets of solar cells that are mounted on the planar mounting.

13. The method of claim 10, wherein the different sets of the solar cells have different spectral response properties.

14. The method of claim 13, wherein the spectral response properties are at least one of absorptive of ultraviolet (UV) and blue light, absorptive of visible light, and absorptive of infrared (IR) photons in differing relative ratios.

15. The method of claim 10, wherein the solar cells are arranged adjacent to one another on the planar mounting.

16. The method of claim 10, wherein the at least one focusing element is a lens.

17. A multi sensor solar collection system, the system comprising:
- a plurality of different sets of solar cells; and
- at least one focusing element,
  wherein the at least one focusing element is configured to focus a light beam on a first set of the solar cells according to a current light condition, and to focus the light beam on a second set of the solar cells by gimballing the at least one focusing element according to a change in the current light condition,
  wherein when the light beam is focused on the first set of the solar cells, the light beam is not focused on the second set of the solar cells,
  wherein when the light beam is focused on the second set of the solar cells, the light beam is not focused on the first set of the solar cells,
  wherein the first set of the solar cells and the second set of the solar cells are configured into a two-dimensional array.

18. A multi sensor solar collection system, the system comprising:
- a plurality of different sets of solar cells;
- at least one focusing element,
  wherein the at least one focusing element is configured to focus a light beam on a first set of the solar cells according to a current light condition; and
- a planar mounting,
  wherein the solar cells are mounted on the planar mounting,
  wherein the planar mounting is configured to gimbal to focus the light beam on a second set of the solar cells according to a change in the current light condition,
  wherein when the light beam is focused on the first set of the solar cells, the light beam is not focused on the second set of the solar cells,
  wherein when the light beam is focused on the second set of the solar cells, the light beam is not focused on the first set of the solar cells,
  wherein the first set of the solar cells and the second set of the solar cells are configured into a two-dimensional array.

19. The method of claim 1, wherein the solar cells are arranged in a matrix configuration.

20. The method of claim 10, wherein the solar cells are arranged in a matrix configuration on the planar mounting.

* * * * *